(12) United States Patent
Warren et al.

(10) Patent No.: US 7,346,822 B2
(45) Date of Patent: Mar. 18, 2008

(54) INTEGRATED CIRCUIT

(75) Inventors: Robert Warren, Bristol (GB); Robert M. Mills, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 478 days.

(21) Appl. No.: 11/101,377

(22) Filed: Apr. 7, 2005

(65) Prior Publication Data
US 2005/0283695 A1 Dec. 22, 2005

(30) Foreign Application Priority Data
Apr. 7, 2004 (EP) .................................. 04252078

(51) Int. Cl.
*G01R 31/28* (2006.01)
(52) U.S. Cl. ...................... 714/731; 714/733; 714/744
(58) Field of Classification Search ................ 714/727, 714/724, 718, 726, 729, 731, 733, 744; 327/99
See application file for complete search history.

(56) References Cited

U.S. PATENT DOCUMENTS

| 5,381,420 A | * | 1/1995 | Henry ........................ 714/731 |
|---|---|---|---|
| 5,877,636 A | * | 3/1999 | Truong et al. ................. 327/99 |
| 5,907,699 A | | 5/1999 | Nakajima |
| 6,014,763 A | * | 1/2000 | Dhong et al. ................ 714/724 |
| 6,019,502 A | * | 2/2000 | Baeg et al. .................. 714/718 |
| 6,430,720 B1 | | 8/2002 | Frey et al. |
| 6,530,053 B1 | | 3/2003 | Suda |
| 6,671,839 B1 | * | 12/2003 | Cote et al. ................... 714/726 |
| 6,742,149 B2 | * | 5/2004 | Osawa ......................... 714/726 |
| 7,007,213 B2 | * | 2/2006 | Wang et al. ................. 714/729 |
| 2002/0144168 A1 | | 10/2002 | Bleakley |

OTHER PUBLICATIONS

European Search Report from French Patent Application No. 04252078, filed Apr. 7, 2004.
Hirabayashi O., et al. "DFT Techniques For Wafer-Level At-Speed Testing of High-Speed SRAMs" Proceedings International Test Conference 2002. ITC 2002. Baltimore, MD, Oct. 7-10, 2002, International Test Conference, New York, NY: IEEE US, Oct. 7, 2002, pp. 164-169, XP010609738.

* cited by examiner

*Primary Examiner*—David Ton
(74) *Attorney, Agent, or Firm*—Lisa K. Jorgenson; James H. Morris; Wolf, Greenfield & Sacks, P.C.

(57) ABSTRACT

An integrated circuit including test circuitry, the test circuitry including a counter for counting clock signals and having an output for providing a control signal. The counter being arranged to have an internal state, and the counter being arranged to change the control signal on the internal state of counter reaching a predetermined value.

32 Claims, 5 Drawing Sheets

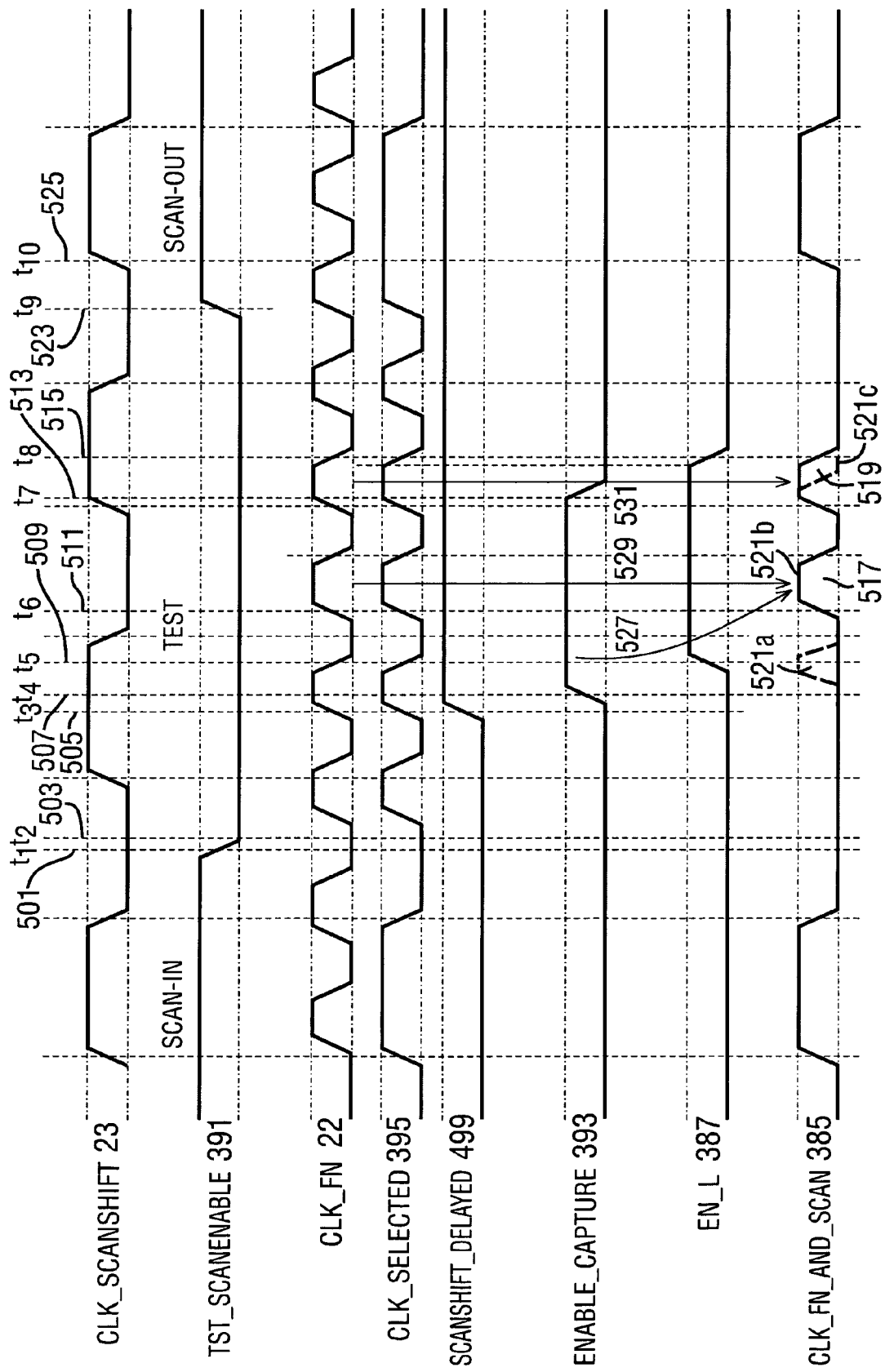

INTEGRATED CIRCUIT

BACKGROUND OF THE INVENTION

1. Field of the Invention

The present invention relates to test circuitry and, in particular, but not exclusively to test circuitry for incorporation in integrated circuits.

2. Discussion of the Related Art

In all but the smallest and simplest of integrated circuits the probability of an error or flaw is such that there is a commercial requirement to perform a test upon the integrated circuit to determine the integrated circuits performance prior to selling the circuit to the end user.

This testing process is automated and features as a step in the production of an integrated circuit. Many different automatic testing protocols have been formulated such as functional tests, scan tests, transition fault tests, and built in self-tests (BIST).

Scan tests and transition fault tests are generally considered to be efficient and are capable of performing extensive testing on the integrated circuit, with scan tests capable of detecting static 'stuck-at' faults and the transition fault tests detecting 'slow-to-rise' or 'slow-to-fall' faults in the circuitry.

'stuck-at' faults are faults where a node of the circuit is incorrectly fabricated and retains a constant potential level. 'slow-to-rise' and 'slow-to-fall' faults are faults where a node is unable to switch between voltage levels within the required time period.

One of the disadvantages of using automatic test equipment and scan testing is that the automatic test equipment clock frequency is limited in speed. These frequency limitations are due to several factors, which include test lead and probe length, the integrated circuit connection pads electrical properties and the test equipment clock switching speeds.

Due to these limitations and the advances in high clock speed integrated circuits it is becoming more common that automatic test equipment clocks are slower than the functional clock rate of the integrated circuit.

This limitation although not affecting the detection of 'stuck-at' faults prevents the detection of 'slow-to-rise' or 'slow-to-fall' faults at the operational frequency of the integrated circuit.

U.S. Pat. No. 6,430,720 describes a ring oscillator on the integrated circuit. This oscillator is used to provide an operational test clock frequency for testing at higher frequencies than provided by the ATE.

"High-Frequency, at-speed Scan Testing", Lin et al, IEEE Design and Test of Computers, September-October 2003, p17-25, describes a method for performing an at-speed scan test wherein the circuit at test is supplied by an at-speed on board clock signal created by using PLL circuit controlled by the off-board clock.

The oscillator though has the disadvantage that the ring oscillator is not the functional clock used in operating the circuitry and thus the results produced by the test may not detect all faults exposed during the operation of the circuitry.

Further problems in using the solution from U.S. Pat. No. 64,300,720 occur as the automatic test equipment clock and the test clock are not synchronized. The switching between unsynchronized clock signals can cause glitches in the output clock where cycles are missed or switched in the middle of a clock cycle.

The operating speed of the Automatic Test Equipment is dependent on the standardization of test routines. Test routines are currently modified by hand in order to carry out a wider range of tests. This increases test time which has an impact on the integrated circuit cost. This test routine inflexibility is especially visible in variable capture count testing.

SUMMARY OF THE INVENTION

It is one aim of the embodiments of the present invention to provide address or at least mitigate the problems described above.

There is provided, according to the invention, an integrated circuit comprising test circuitry, said test circuitry comprising a counter for counting clock signals and having an output for providing a control signal, said counter arranged to have an internal state, and said counter is arranged to change said control signal on said internal state of counter reaching a predetermined value.

The counter may comprise a clock input, said counter being preferably arranged to change its internal state on receiving a clock signal transition on said clock input.

The counter may further comprise an enable input, wherein the control signal value may be output in dependence on an enable signal value on said enable input.

The counter is preferably a decrementer.

The known value may be zero.

The counter may be a linear feedback shift register (LFSR).

The counter may have an input for receiving an initial internal state, the counter preferably being arranged to be loaded with a first internal state during a test initiation.

The counter may be arranged to receive a start signal to cause said counter to start counting.

The control signal value may be output in dependence on said start signal.

When the first internal state has a second predetermined value, said counter may be arranged to provide said control signal and said counter is preferably further arranged to prevent the internal state from changing on receiving a clock signal transition on said clock input.

When said first internal state has a third predetermined value, said counter may be arranged to stop providing said control signal and said counter is preferably further arranged to prevent the internal state from changing on receiving a clock signal transition on said clock input.

BRIEF DESCRIPTION OF DRAWINGS

For a better understanding of the present invention and how the same may be carried into effect, reference will now be made by way of an example only to the accompanying drawings in which:

FIG. 5 shows a timing diagram showing clock and timing signals during an automatic test as shown in FIG. 4.

DETAILED DESCRIPTION

Figure 1:
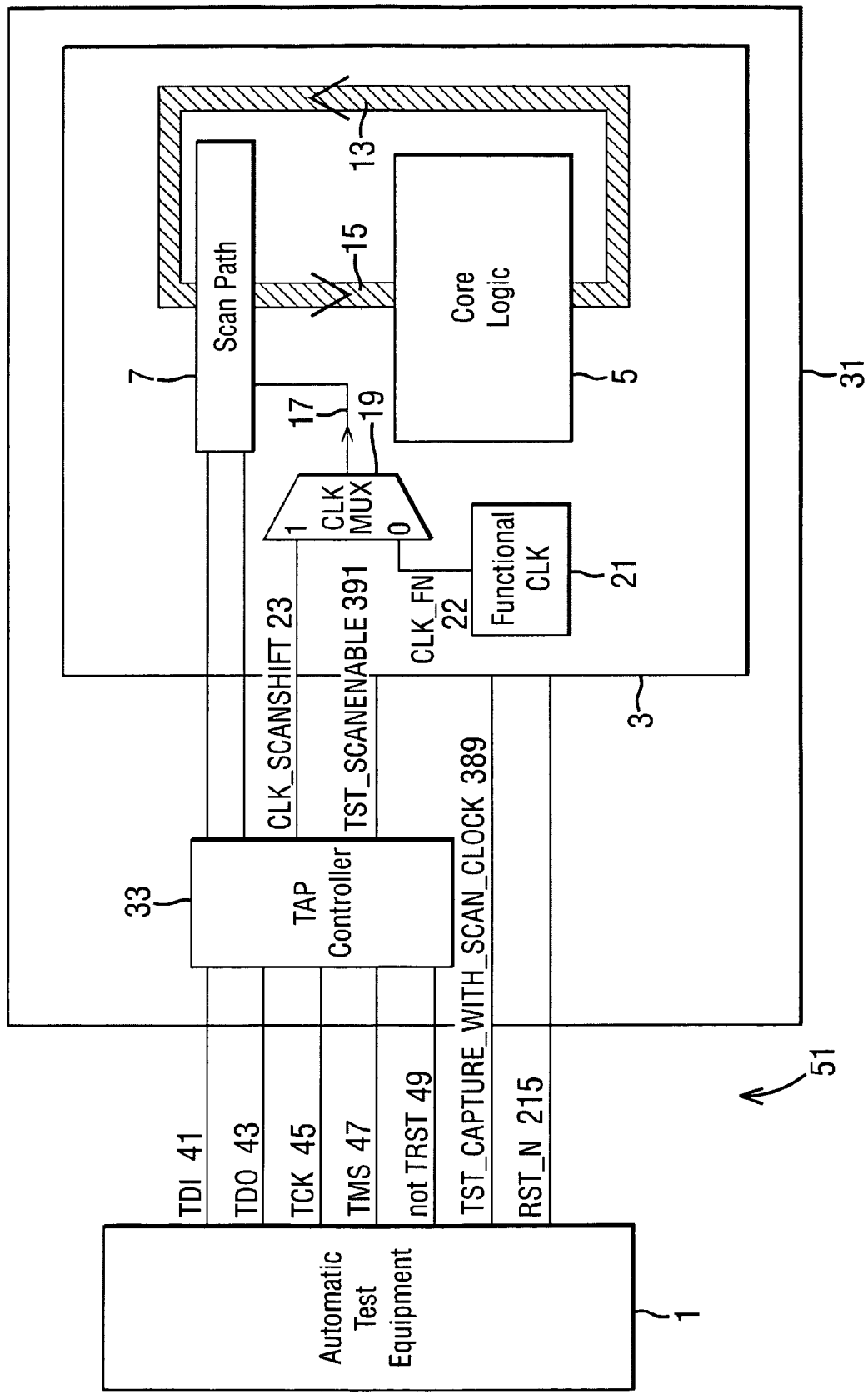
FIG. 1 shows a schematic view of a test environment featuring a schematic view of an integrated circuit and automatic test equipment.

Reference is made to FIG. 1, which shows a first embodiment of the invention incorporated into a test environment for testing an integrated circuit using scan testing.

The scan test environment 51 comprises an automatic test equipment (ATE) 1 which is connected to an integrated circuit to be tested 31.

The automatic test equipment has many roles in the testing of an integrated circuit. The ATE 1 supplies to the integrated circuit 31 a variety of test signals used in the testing of the integrated circuit. Some of these signals have been defined by the Joint Testing Action Group (JTAG). The test data input (TDI) 41 and test data output (TDO) 43 signals being test sequences or vectors.

The ATE 1 further supplies the integrated circuit 31 under test an automatic test equipment clock TCK 45 for synchronising the test procedure and also supplies control signals; Test mode select TMS 47, and test reset signal notTRST 49. These signals together with the TDI 41 and TDO 43 signal connections are known as the test access port (TAP) interface signals.

The ATE 1 supplies the integrated circuit 31 with two further signals, TST_CAPTURE_WITH_SCAN_CLK 389, and RST_N 215 The TST_CAPTURE_WITH_SCAN_CLK signal 389 determines whether the capture step 607 is performed using the ATE controlled clock, CLK_SCANSHIFT 23, or the on-chip generated clock, CLK_FN 22. The RST_N signal 215 performs a functional reset on the integrated circuit.

In addition to supplying the integrated circuit 31 the TAP interface signals, the TST_CAPTURE_WITH_SCAN_CLK signal 389, and the RST_N signal 215, the ATE 1 controls and observes all other functional inputs and outputs. It should be realised that there are many ways in which the connectivity between ATE 1 and integrated circuit 31 may be achieved.

The ATE 1 also calculates or knows the expected test vector from the known functionality of the circuit under test, and compares the received and calculated test vectors in order to detect faults on the integrated circuit.

The integrated circuit 31 comprises a test access port controller (TAP controller) 33 and a functional test integrated circuit 3.

The TAP controller 33 is configured by the ATE 1, such that the ATE 1 has outputs and controls the on-chip signals: CLK_SCANSHIFT 23; TST_SCANENABLE 391; and SCAN_IN 9; and receives the SCAN_OUT signal 11. The CLK_SCANSHIFT signal 23 being the on-chip equivalent of the ATE clock TCK 45, and SCAN_IN 9 and SCAN_OUT 11 being the on-chip equivalent to TDI 41 and TDO 43 respectively. The signal TST_SCANENABLE 391 selects whether the functional integrated circuit is in test or functional mode. The on-chip signals CLK_SCANSHIFT 23; TST_SCANENABLE 391; and SCAN_IN 9; are dependent on the received TAP interface signals Test Clock 45 TCK; 47 TMS; Test data input 41 TDI; and Test data output 43 TDO. The functions of known TAP controllers are defined by IEEE Standard 1149.1-1990 which is hereby incorporated by reference.

The functional integrated circuit 3 as shown in FIG. 1, shows a functional integrated circuit 3 comprising core logic 5 for processing the functional signals; a scan path 7 which during the testing of the circuit is connected to the ATE and receives test vectors over a first connection SCAN_IN 9 and outputs test vectors over a second connection SCAN_OUT 11; a functional clock 21 designed to produce a clock signal CLK_FN 22 at the operating frequency of the integrated circuit; a clock multiplexer 19 which is connected to both the functional clock 21 and also the ATE clock and outputs one of the clocks to the integrated circuit clock distribution network 17 dependent on a selection signal CLK_SELECTOR 399 (not shown). The selection signal is a function of TST_SCANENABLE 391 and TST_CAPTURE_WITH_SCAN_CLK 389.

The use of the functional clock 21 during testing allows the circuit to be tested at operational frequencies greater than can be supplied by the automatic test equipment. Furthermore the use of the functional clock 21 in testing as well as the operation of the integrated circuit produces test situations that are closer to the operating conditions of the integrated circuit increasing the accuracy of the test results.

A feature of the present invention is the presence of the additional control signal TST_CAPTURE_WITH_SCAN_CLK 389. TST_CAPTURE_WITH_SCAN_CLK 389 determines whether the capture step 607 is performed using the ATE controlled clock, CLK_SCANSHIFT 23, or the on-chip generated clock, CLK_FN 22. This differs from the current test environments where existing Automatic Test Pattern Generation (ATPG) software used to generate the test patterns are not cognisant of the apparatus of the present invention. Therefore, if ATPG is instructed to generate patterns with TST_CAPTURE_WITH_SCAN_CLK 389 asserted, then the correct patterns are generated.

Furthermore, these test patterns can be applied to the device and the corresponding response is correct, with only the provision that the transition fault testing is performed at the speed of the clock, CLK_SCANSHIFT 23, supplied by ATE 1 instead of at the speed of the functional operating clock, CLK_FN 22.

Then, merely by deasserting TST_CAPTURE_WITH_SCAN_CLK 389, the test can be repeated, but now the transition fault testing is performed at the speed of the functional operating clock, CLK_FN 22. Thus the present invention allows transition fault testing at functional speed without the need to change existing ATPG and other software.

Figure 2:
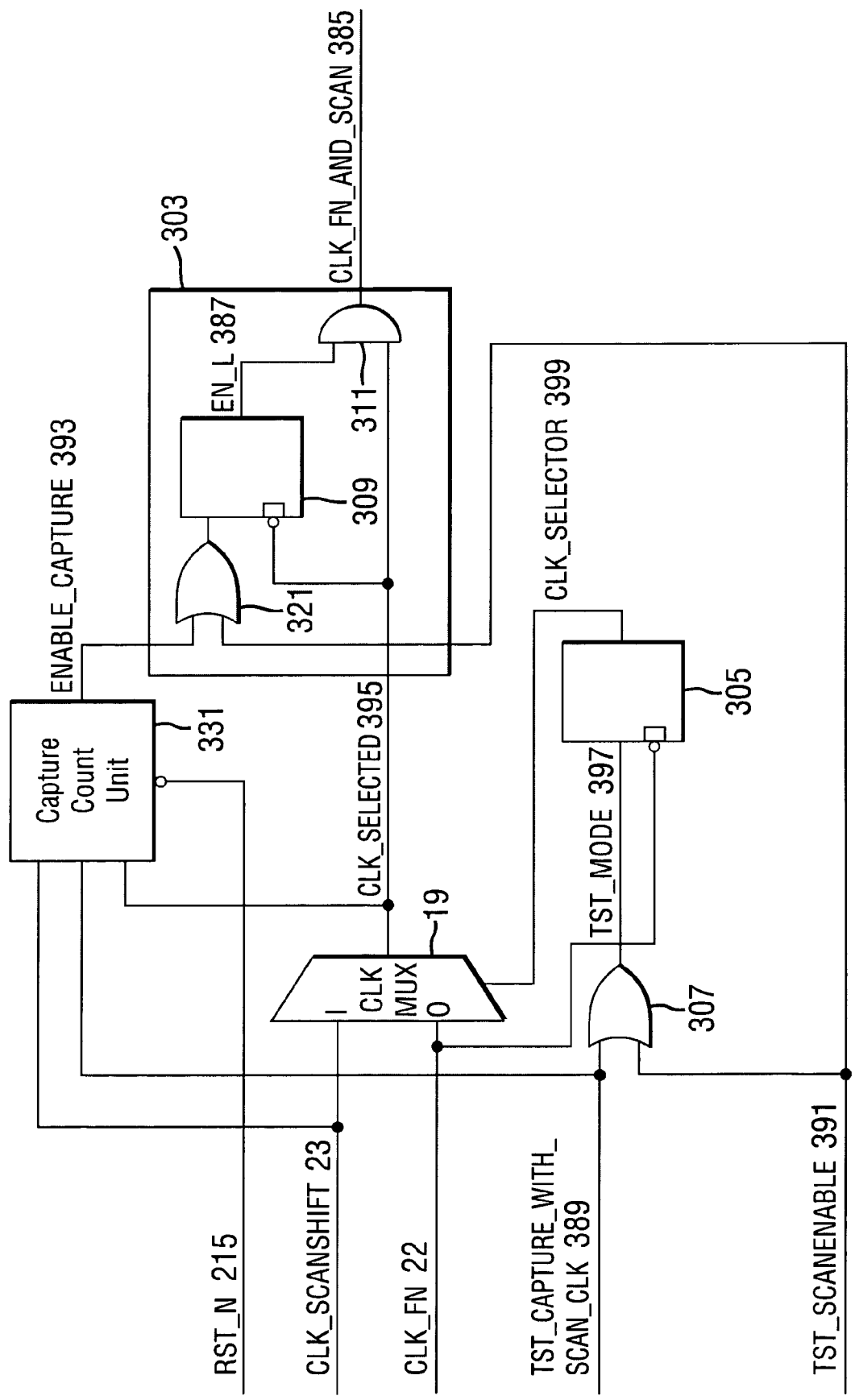
FIG. 2 shows a schematic view of a first embodiment of the test control logic as used in the present invention.

FIG. 2 shows circuitry embodying the present invention.

The circuitry of FIG. 2 comprises a clock multiplexer 19 which has one clock input connected to functional clock signal 22 CLK_FN from the functional clock 21, a second clock input connected to the automatic test equipment clock signal 23 CLK_SCANSHIFT, and a selection input connected to the output of a transparent latch 305. The output of the clock multiplexer 19 is connected to both the clock input of a second transparent latch 309 and an input of an AND gate 311.

The data input of the first transparent latch 305 is supplied a test mode signal 397 TST_MODE from a first OR gate 307. The clock input of the first transparent latch 305 is connected to the functional clock signal 22 CLK_FN.

The data input of the second transparent latch 309 is supplied by the output of a second OR gate 321. The second OR gate 321 has a first input connected to an enable capture signal 393 ENABLE_CAPTURE from a capture count unit 331, and a second input connected to the TST_SCANENABLE signal 391 connection.

The output of the second transparent latch 309 is connected to the second input of the AND gate 311. The output of the AND gate 311 supplies the clock signal 385 CLK_FN_AND_SCAN to the clock distribution network.

The first OR gate 307 receives a scan enable signal 391 TST_SCANENABLE and a scan type signal 389 TST_

CAPTURE_WITH_SCAN_CLK and provides the test mode signal 397 TST_MODE to the first transparent latch 305.

The second transparent latch 309 and the AND gate 311 form the basis of a gated clock buffer unit 303. The clock buffer unit in some embodiments is also known as a clock gating element. The gated clock buffer unit 303 receives the selection signal TST_SCANENABLE 391 from the automatic test equipment.

Figure 3:
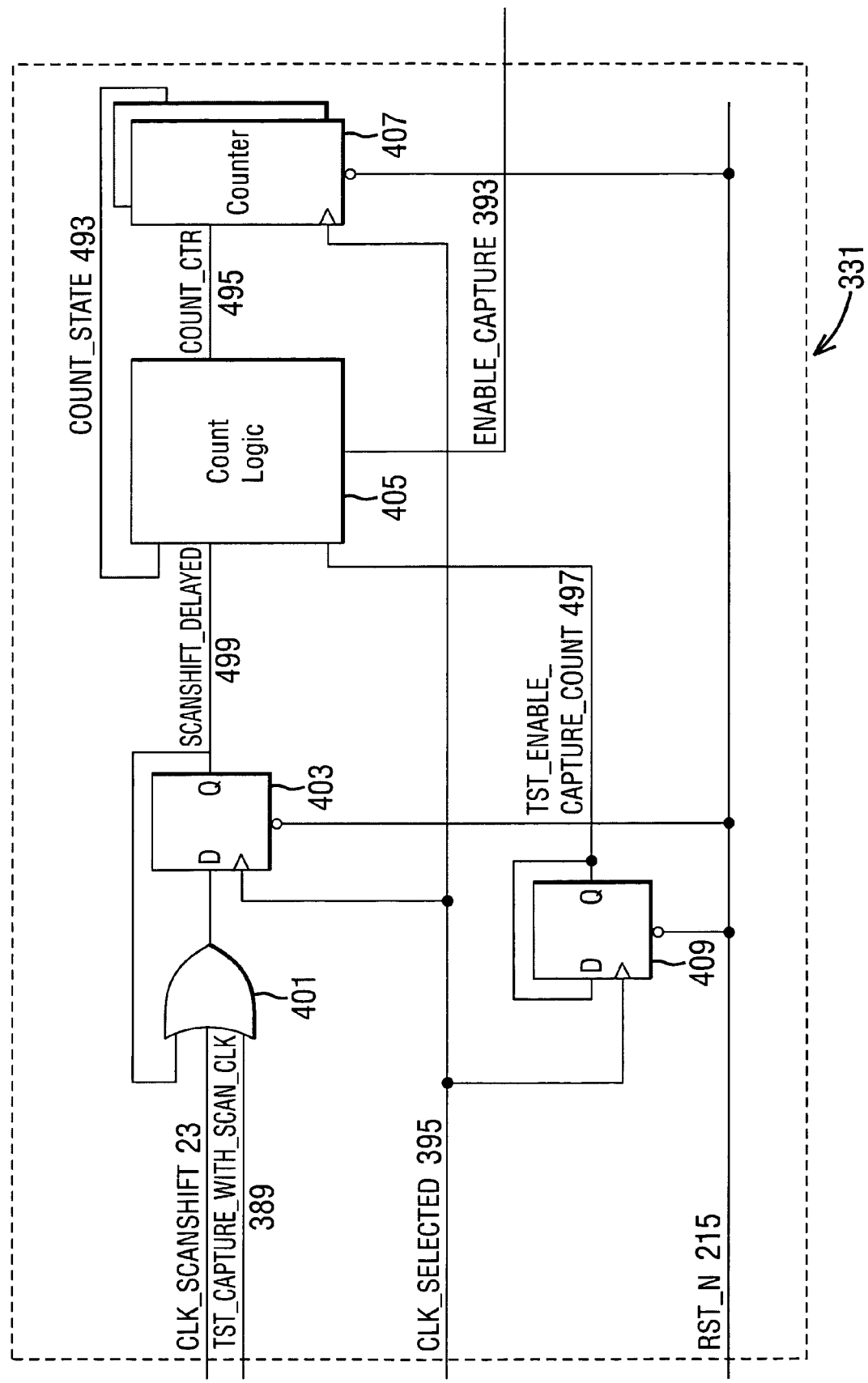
FIG. 3 shows a schematic view of the capture count circuitry as shown in FIG. 2.

FIG. 3 shows the capture count unit 331 in more detail. The capture count unit 331 comprises has a 3-input OR gate 401 with a first input connected to the clock signal 23 CLK_SCANSHIFT, a second input connected to the test mode control signal 389 TST_CAPTURE_WITH_SCAN_CLK supplied from the automatic test equipment, and an output connected to a data input of a first flip-flop 403.

The clock input of the first flip-flop 403 is connected to the selected clock signal CLK_SELECTED 395 from the clock multiplexer 19 and has an output which is connected to both the third input of the 3-input OR gate 401 and also connected to the start input of a count logic unit 405.

A data output of a second flip-flop 409 is connected to the data input of the second flip-flop 409 and also to an enable input of the count logic unit 405. The second flip-flop 409 has a clock input connected to the selected clock signal 395 CLK_SELECTED.

The count logic unit 405 has a further count state input connected to the output of the counter flip-flops 407 COUNT_STATE. A count control signal COUNT_CTR 495 from the output of the control logic 405 is connected to the input of the counter flip-flops 407. The counter flip-flops 407 have a clock input connected to the selected clock signal CLK_SELECTED 395.

The capture count unit 331 produces the ENABLE_CAPTURE signal. The ENABLE_CAPTURE signal 393 is input to the gated clock buffer unit 303 and controls the number of pulses that are transmitted to the rest of the integrated circuit in the capture phase of the test.

The count logic unit 405 and counter flip-flops 407 form a counter for counting a number of pulses received on the clock input 395 of the counter flip flops 407. In a first embodiment of the present invention the counter is a simple decrementing circuit outputting a high ENABLE_CAPTURE signal 393 until the state value reaches zero.

In such an embodiment the counter has an initial value n (called a divider value) and produces an ENABLE_CAPTURE 393 signal for n+1 clock periods.

The number of clock periods required to perform a test is dependent on the type of test and the type of integrated circuit being tested. For example in integrated circuits which require more than a single clock cycle to propagate the result signal to a scan chain element more than a single cycle test will be required. For integrated circuits with separate clocks for different parts of the integrated circuits it can be necessary to perform more than the smallest number of clock cycles required by the test type. For example a circuit where one part runs at twice the speed as another part the highest speed functional clock is chosen and double the number of functional clock cycles chosen to run the test so that the slower part is able to produce a test result.

The count logic 405 is started once the count logic receives a start signal. The start signal SCANSHIFT_DELAYED 499 is generated when any of the inputs for the 3-input OR gate 401 are high and the first flip-flop 403 receives a clock edge on the edge detecting clock input 423. Once the start signal SCANSHIFT_DELAYED 499 goes high the signal will stay high for the remainder of the capture phase, that is until scan data is shifted through this flip-flop during the next scan shift phase. Furthermore it can be seen that in this embodiment a high value CLK_SCANSHIFT 23 or TST_CAPTURE_WITH_SCAN_CLK 389 will cause the 3-input OR gate 401 to produce a high output which would start the counter as soon as the first CLK_SELECTED signal is received.

Figure 4:
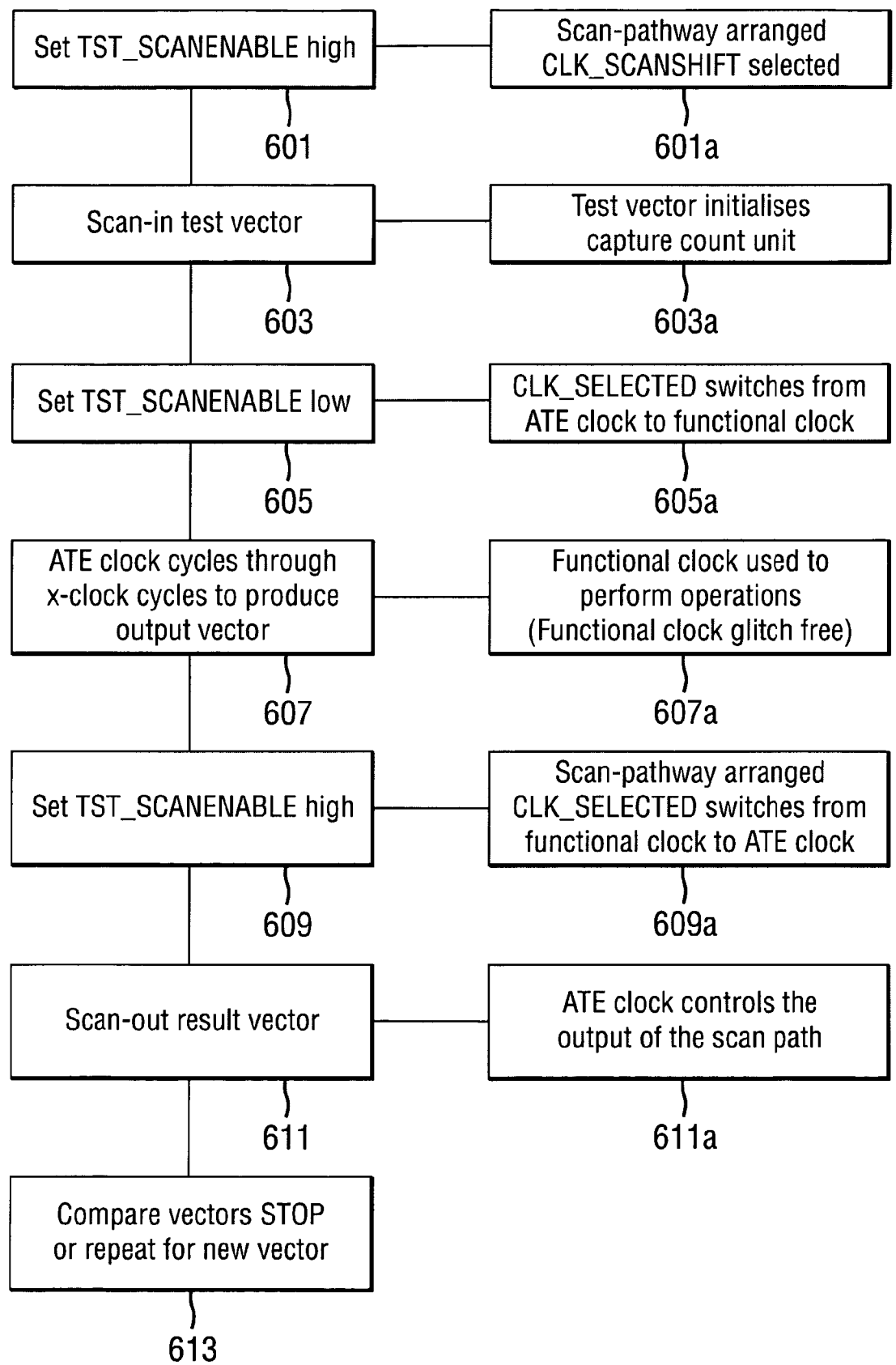
FIG. 4 shows a flow diagram showing the method used in performing an automatic test as applied to embodiments of the present invention.

FIGS. 4 and 5 show a flow diagram of a scan test, and a timing diagram showing examples of signals received by and generated by the integrated circuit during a scan test respectively. The test being carried out in this example is one which requires the use of the functional clock signal CLK_FN 22 and therefore the automatic test equipment 1 sets the TST_CAPTURE_WITH_SCAN_CLK signal to low.

The left hand side of FIG. 4 shows the processes carried out by automatic test equipment 1. The pathway on the right shows the effects of the automatic test equipment 1 on the integrated circuit 3 and the test control functional block 201 in particular.

In the first step 601 the automatic test equipment sets the signal TST_SCANENABLE 391 high in preparation for scanning in the test vector. The integrated circuit in response to this arranges the memory elements of the integrated circuit, both test and functional memory elements, to form the scan path. As can be seen in FIG. 2 the TST_SCANENABLE signal 391 is input into the first OR gate 307 and also to the second OR gate 321 in the gated clock buffer 303. The TST_SCANENABLE signal 391 is propagated through the first OR gate 307 and the first transparent latch 305 to select the test clock signal CLK_SCANSHIFT 23 at the clock multiplexer 19 to be output as the CLK_SELECTED signal 395. Furthermore the TST_SCANENABLE signal input into the second OR gate 321 activates the gated clock buffer to pass the CLK_SELECTED signal 395 without the need for an enable capture 393 signal.

In an alternative embodiment, the first OR gate 307 is placed after the transparent latch 305; and this allows conventional scan testing even if the functional clock CLK_FN 22 is not running.

In the next step 603, the automatic test equipment 1, transmits on the scan path the test vector. The integrated circuit in step 603a receives the test vector. The test vector not only prepares the integrated circuit for being tested by entering the signals which will produce the result value but is used to initialize various test scan path elements. The counter flip-flops 407 within the capture count unit can be configured with the divider value. The first 403 and second 409 flip-flops can be configured to be switched on or off from the start of the capture phase.

In the next step 605, the automatic test equipment 1, prepares to perform the functional test element of the test. The TST_SCANENABLE 391 signal is brought low. This can be seen in FIG. 5 at the time $t_1$ 501. In the integrated circuit the response 605a to bringing the TST_SCANENABLE signal low at time $t_1$ 501 is to switch off the scan path connecting the memory elements and return the data paths to the test pathways. The test control functional block 201 also responds to the change of state of the TST_SCANENABLE signal 391. The first OR gate 307 having received a low TST_SCANEABLE signal 391 transmits a low test mode signal TST_MODE 397 to the input of the first transparent latch 305. This is passed to the clock multiplexer 19 at the next low functional clock cycle $t_2$ 503. Thus by the rise of the next functional clock signal the selected clock signal CLK_SELECTED 395 from the output of the clock multiplexer 19 is that of the functional clock signal CLK_FN 22.

The test scan enable signal TST_SCANENABLE 391, input into the gated clock buffer 303 as the input to the second OR gate 321, switches the gated clock buffer 303 so that the gated clock buffer 303 requires an enable capture signal ENABLE_CAPTURE 393 in order to output a CLK_FN_AND_SCAN signal 385.

The TST_SCANENABLE signal change also switches the capture count unit 331 from scan shifting to functional operation. At the next instance of the automatic test equipment clock going high CLK_SCANSHIFT, the first flip-flop 403 receives a high input which is passed as a high SCANSHIFT_DELAYED signal 499 from the output when clocked by the CLK_SELECTED signal 395 (in other words the next functional clock edge). This can be seen in FIG. 5 at the time instance $t_3$ 505. The count logic 405 receives the SCANSHIFT_DELAYED signal 499, actives the count flip-flops 407 using the count control signal COUNT_CTR 495 and outputs an enable capture ENABLE_CAPTURE 393 signal to the gated clock buffer unit 303. This output change can be seen in FIG. 5 at the time instance $t_4$ 507.

In the step 607, the capture phase, the automatic test equipment 1 performs the desired number of functional clock cycles. In the example shown in FIG. 5 the test has been configured to carry out two clock cycles before scanning out the signal.

The second transparent latch 309 having received a high enable capture signal ENABLE_CAPTURE 393 from the capture count unit 331, via the second OR gate 321, passes a high signal EN_L 387 when clocked low by the next selected clock signal CLK_SELECTED (i.e. where the selected clock is the functional clock CLK_FN 22). This is shown in FIG. 5 at the time instance $t_5$ 509 when the EN_L signal goes high. The EN_L signal 387 operates as a gating signal, in that, when the EN_L signal 387 is high the AND gate passes the selected clock signal CLK_SELECTED 395 and when the EN_L 387 signal is low the selected clock signal CLK_SELECTED 395 is blocked. This can be seen in FIG. 5 in the clock pulses output on the CLK_FN_AND_SCAN signal 385 after the time instance $t_6$ 511. The arrow marked 527 in FIG. 5 shows the propagation of the gating signal that passes from the ENABLE_CAPTURE signal 393 to the EN_L signal 387. This gating signal allows the clock pulses from the functional clock CLK_FN 22 to be passed to the CLK_FN_AND_SCAN signal output 385 as shown by the arrows 529 and 531 in FIG. 5.

The number of clock pulses on the CLK_FN_AND_SCAN signal passed by the AND gate 311 in the test part is determined by the length of the enable capture ENABLE_CAPTURE 393 signal as the signal is kept high. This is in turn determined by the count value stored in the counter flip-flops 407. The counter flip-flops decrement the stored count value on every CLK_SELECTED rising edge. The stored count value is also received by the count logic unit 405 via the count state signal COUNT_STATE 493. When the stored count value reaches zero the count logic unit 405 brings the enable capture signal ENABLE_CAPTURE 393 low. In FIG. 5 this is shown at time instance $t_7$ 513 where on the second rising selected clock edge CLK_SELECTED 395 (i.e. the second rising functional clock edge CLK_FN 22) after $t_6$ 511 the enable capture signal ENABLE_CAPTURE 393 is brought low.

The second transparent latch 309 receives the change in the enable capture signal ENABLE_CAPTURE 393 from the capture count unit 331 but does not transmit the change as the EN_L signal 387 until the clock signal CLK_SELECTED 395 has a low level. This change is shown in FIG. 5 at time instance $t_8$ 515. With the signal EN_L 387 low input to the AND gate 311 no further clock pulses are passed from the selected clock signal CLK_SELECTED 395 to the output clock signal CLK_FN_AND_SCAN 385 during the remainder of the capture phase. FIG. 5 shows the two complete functional clock high pulses 517 and 519 passed from the functional clock CLK_FN 22 to the output clock CLK_FN_AND_SCAN 385 via the selected clock CLK_SELECTED 395. An unbuffered series of clock pulses are also shown in FIG. 5 as the dashed line 521. The unbuffered clock signals 521 are those generated by the gating of the functional clock signal CLK_FN 22 with the enable capture signal ENABLE_CAPTURE 393. As can be seen in FIG. 5 three clock pulses are produced 521$a$, 521$b$, and 521$c$ with the first 521$a$ and last 521$c$ being clipped versions of the original functional clock signal CLK_FN 22. Embodiments of the invention as described above therefore prevent such clipped or glitched clock signals from being output.

In the step 609 the automatic test equipment 1 sets the scan mode signal TST_SCANENABLE 391 high. This can be seen in FIG. 5 at time instance $t_9$ 523. The integrated circuit's response to this change in the TST_SCANENABLE signal 391 is seen in FIG. 4 by the step 609$a$. The integrated circuit switches the scan chain elements from test data paths to the scan paths. The TST_SCANENABLE signal 391 is input into the OR gate 307 and the gated clock buffer 303. The TST_SCANENABLE signal 391 is propagated through the first OR gate 307 and the first transparent latch 305 to select the automatic test clock signal CLK_SCANSHIFT 23 at the clock multiplexer 19 to be output as the CLK_SELECTED signal 395. As the first transparent latch 305 is controlled by the functional clock signal 22 CLK_FN it is unable to pass the change in signal to the clock multiplexer 19 until the functional clock signal 22 CLK_FN is low. This arrangement lowers the possibility of glitching caused by the switching between unsynchronized clock signals. Furthermore the TST_SCANENABLE signal 391 passed to the second OR gate 321 activates the gated clock buffer 303, to pass the CLK_SELECTED signal 395 without the need for an enable capture signal 393. This can be seen in FIG. 5 at the time instance $t_{10}$ 525 where the output clock CLK_FN_AND_SCAN 385 outputs an automatic test equipment clock pulse CLK_SCANSHIFT 23.

In the step 611 the automatic test equipment 1 reads or scans out the values stored in the memory elements of the integrated circuit. The integrated circuit in step 611$a$ continues to receive the automatic test equipment clock and synchronises the reading out of the values via the scan-out path using the ATE clock (CLK_SCANSHIFT) 23 as output on the CLK_FN_AND_SCAN signal 385.

Finally in step 613 the automatic test equipment 1 compares the received result test vector to the calculated or known result test vector to determine the number and possible position of faults in the integrated circuit.

In some embodiments of the invention the OR gate 307 functions as a control switch with the scan type signal 389 TST_CAPTURE_WITH_SCAN_CLK determining whether the functional clock is to be selected during the capture phase of the test. For example in static scan testing using a single clock cycle there is no requirement to perform 'slow-to' tests and therefore the clock multiplexer 19 and the capture count unit 331 are forced by a high scan type signal 389 TST_CAPTURE_WITH_SCAN_CLK to always select and count the slower automatic test equipment clock CLK_SCANSHIFT 23.

In other embodiments of the present invention other counters as known in the art can be used to produce a signal for a desired number of periods. For example in one embodiment a counter counting up to a maximum value, or a linear feedback shift register with the desired cycle length could be used.

In some embodiments of the present invention not all of the counter values are used. If the counter logic unit 405 detects a specific value stored in the counter flip-flops 407, then a start signal does not begin a fixed length scan or transition test but triggers the capture count unit 331 to start outputting 'infinite count' ENABLE_CAPTURE signals 393. Furthermore in the same embodiments of the present invention the counter logic unit 405 can detect a further value stored in the counter flip-flops 407 and stops the capture count unit 331 from outputting the ENABLE_CAPTURE signal 393.

Embodiments of the present invention incorporating the 'infinite count' start and stop can be used to provide the integrated circuit with the capacity to perform built in self-test at speed (not shown). The built in self test (BIST) requires significantly more clock pulses than those required during the capture phase of the scan tests.

In other embodiments of the present invention there may be more than one test control unit 201 and therefore capture count unit 331 per integrated circuit (not shown). Each capture count unit 331 can be connected via the clock multiplexer 19 to a separate clock. In order to switch one capture count unit on whilst preventing another from being activated the fourth flip-flop 409 is configured to produce a high value to activate the counter. As previously described this configuration step can be carried out by the SCAN-IN signals 9 passed during the scan-in part of the test.

In further embodiments of the present invention the gated clock buffer 303 comprises a NOR gate and OR gate. The NOR gate receives the result of the OR'ed ENABLE_CAPTURE 393 and TST_SCANENABLE 391 signals and also the CLK_SELECTED signal 395. The output of the NOR gate connected to a first input of the OR gate. The second input of the OR gate is the CLK_SELECTED signal 305 with the output of the OR gate being the CLK_FN_AND_SCAN signal 385.

In other embodiments the second OR gate 321 is moved from the gated clock buffer 303 to be before the gated clock buffer in the enable signal path.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit comprising test circuitry, said test circuitry comprising a counter for counting clock signals and having an output for providing a control signal, said counter arranged to have an internal state, and said counter is arranged to change said control signal on said internal state of said counter reaching a predetermined value.

2. An integrated circuit as claimed in claim 1, wherein said counter comprises a clock input, said counter being arranged to change said internal state on receiving a clock signal transition on said clock input.

3. An integrated circuit as claimed in claim 1, wherein said counter further comprises an enable input, wherein the control signal value is output in dependence on an enable signal value on said enable input.

4. An integrated circuit as claimed in claim 1, wherein said counter is a decrementer.

5. An integrated circuit as claimed in claim 4, wherein said predetermined value is zero.

6. An integrated circuit as claimed in claim 1, wherein said counter is a linear feedback shift register (LFSR).

7. An integrated circuit as claimed in claim 1, wherein said counter has an input for receiving an initial internal state, said counter being arranged to be loaded with a first internal state during a test initiation.

8. An integrated circuit as claimed in claim 7, wherein when said first internal state has a second predetermined value, said counter is arranged to provide said control signal and said counter is further arranged to prevent the internal state from changing on receiving a clock signal transition on said clock input.

9. An integrated circuit as claimed in claim 7, wherein when said first internal state has a third predetermined value, said counter is arranged to stop providing said control signal and said counter is further arranged to prevent the internal state from changing on receiving a clock signal transition on said clock input.

10. An integrated circuit as claimed in claim 1, wherein said counter is arranged to receive a start signal to cause said counter to start counting.

11. An integrated circuit as claimed in claim 10, wherein the control signal is output in dependence on said start signal.

12. A test procedure for testing an integrated circuit, the test procedure comprising:
providing an integrated circuit having test circuitry, said test circuitry comprising a counter;
counting clock signals with the counter;
outputting a control signal from the counter; and
changing the control signal based on an internal state of the counter reaching a predetermined value.

13. The test procedure as claimed in claim 12, further comprising changing an internal state of the counter based on the counter receiving a clock signal transition.

14. The test procedure as claimed in claim 12, wherein outputting the control signal from the counter comprises outputting the control signal value in dependence on an enable signal value.

15. The test procedure as claimed in claim 12, wherein counting clock signals with the counter comprises counting backward.

16. The test procedure as claimed in claim 14, wherein counting backward comprises reaching a predetermined value of zero.

17. The test procedure as claimed in claim 12, further comprising providing to the integrated circuit an initial internal state during a test initiation.

18. The test procedure as claimed in claim 17, further comprising preventing changing the internal state on receiving a clock signal transition when the internal state is at a second predetermined value.

19. The test procedure as claimed in claim 17, further comprising stopping providing said control signal and preventing changing the internal state on receiving a clock signal transition when the internal state is at a third predetermined value.

20. The test procedure as claimed in claim 12, further comprising providing to the integrated circuit a start signal to cause said counter to start counting.

21. The test procedure as claimed in claim 20, wherein outputting the control signal comprises outputting the control signal in dependence on the start signal.

22. An integrated circuit comprising:
- test circuitry comprising a means for counting clock signals and a means for providing a control signal, said means for counting clock signals having an internal state, said means for providing a control signal being arranged to change said control signal on said internal state of said means for counting reaching a predetermined value.

23. The integrated circuit as claimed in claim 22, wherein said means for counting clock signals comprises a clock input, said means for counting clock signals being arranged to change the internal state on receiving a clock signal transition on said clock input.

24. The integrated circuit as claimed in claim 22, wherein said means for counting clock signals further comprises an enable input, wherein the control signal value is output in dependence on an enable signal value on said enable input.

25. The integrated circuit as claimed in claim 22, wherein said means for counting clock signals comprises a decrementer.

26. The integrated circuit as claimed in claim 25, wherein said predetermined value is zero.

27. The integrated circuit as claimed in claim 22, wherein said means for counting clock signals comprises a linear feedback shift register (LFSR).

28. The integrated circuit as claimed in claim 22, wherein said means for counting clock signals has an input for receiving an initial internal state, said means for counting clock signals being arranged to be loaded with a first internal state during a test initiation.

29. The integrated circuit as claimed in claim 28, wherein when said first internal state has a second predetermined value, said means for counting clock signals is arranged to provide said control signal and said means for counting clock signals is further arranged to prevent the internal state from changing on receiving a clock signal transition on said clock input.

30. The integrated circuit as claimed in claim 28, wherein when said first internal state has a third predetermined value, said means for counting clock signals is arranged to stop providing said control signal and said means for counting clock signals is further arranged to prevent the internal state from changing on receiving a clock signal transition on said clock input.

31. The integrated circuit as claimed in claim 22, wherein said means for counting clock signals is arranged to receive a start signal to cause said means for counting clock signals to start counting.

32. The integrated circuit as claimed in claim 31, wherein the control signal is output in dependence on said start signal.

* * * * *